US010502914B2

(12) United States Patent
Chiron et al.

(10) Patent No.: US 10,502,914 B2
(45) Date of Patent: Dec. 10, 2019

(54) STACKABLE TELECOMMUNICATION CABINET CONSTRUCTION

(71) Applicant: OFS Fitel, LLC, Norcross, GA (US)

(72) Inventors: Xavier Chiron, Atlanta, GA (US); Wladyslaw Czosnowski, Duluth, GA (US)

(73) Assignee: OFS FITEL, LLC, Norcross, GA (US)

( * ) Notice: Subject to any disclaimer, the term of this patent is extended or adjusted under 35 U.S.C. 154(b) by 0 days.

(21) Appl. No.: 15/718,395

(22) Filed: Sep. 28, 2017

(65) Prior Publication Data

US 2018/0284377 A1    Oct. 4, 2018

Related U.S. Application Data

(60) Provisional application No. 62/477,813, filed on Mar. 28, 2017.

(51) Int. Cl.
| G02B 6/36 | (2006.01) |
| G02B 6/44 | (2006.01) |
| A47B 87/02 | (2006.01) |
| H05K 7/18 | (2006.01) |

(52) U.S. Cl.
CPC ........ *G02B 6/4446* (2013.01); *A47B 87/0276* (2013.01); *G02B 6/445* (2013.01); *G02B 6/4454* (2013.01); *G02B 6/4471* (2013.01); *H05K 7/186* (2013.01)

(58) Field of Classification Search
USPC ................................................ 385/100, 135
See application file for complete search history.

(56) References Cited

U.S. PATENT DOCUMENTS

| 6,250,816 | B1* | 6/2001 | Johnston | G02B 6/3897 |
| | | | | 385/135 |
| 10,261,281 | B2* | 4/2019 | Geens | G02B 6/4452 |
| 2006/0228086 | A1* | 10/2006 | Holmberg | G02B 6/4452 |
| | | | | 385/135 |
| 2008/0219789 | A1* | 9/2008 | Johnson | B23B 47/28 |
| | | | | 408/204 |
| 2014/0161410 | A1* | 6/2014 | Thijs | H05K 7/186 |
| | | | | 385/135 |
| 2016/0134092 | A1* | 5/2016 | Bonvallat | H05K 5/0247 |
| | | | | 248/68.1 |
| 2017/0332498 | A1* | 11/2017 | Larsson | H02G 3/086 |

\* cited by examiner

*Primary Examiner* — Eric Wong
(74) *Attorney, Agent, or Firm* — Law Office of Leo Zucker (57) ABSTRACT

A telecommunication cabinet for managing connections between incoming and outgoing cables at building premises. The cabinet has a back wall, and bottom, top, left, and right walls. The bottom wall has a first incoming cable port that opens at a front edge of the bottom wall, the top wall has a second incoming cable port that opens at a front edge of the top wall, and the second incoming cable port is aligned vertically with the first incoming cable port. At least one of the right and the left walls has an outgoing cable port. Layers of incoming cables can enter the cabinet for connection, or pass through the cabinet to enter a second cabinet, by inserting the layers from the front of the cabinet into one or both of the incoming cable ports. Cable clamp assemblies fix the cables of each layer at corresponding positions inside the ports.

14 Claims, 9 Drawing Sheets

FIG. 9

STACKABLE TELECOMMUNICATION CABINET CONSTRUCTION

CROSS REFERENCE TO RELATED APPLICATION

This application claims priority under 35 U.S.C. § 119(e) of U.S. Provisional Patent Application No. 62/477,813 filed Mar. 28, 2017, titled "Stackable Telecommunication Cabinet," the entire contents of which are incorporated by reference.

BACKGROUND OF THE INVENTION

Field of the Invention

The present invention relates to telecommunication cabinets, particularly cabinets for managing and connecting cables that enter a premises from outside, to cables that are routed to locations inside the premises.

Discussion of the Known Art

Certain telecommunication cabinets known as optical cable entrance facilities (OCEFs) are deployed at large central offices and data centers, and are often installed in a basement at the premises. OCEFs act as transition points between optical fibers of cables that enter the premises from outside, and optical fibers of cables that are routed interiorly to destinations inside the premises. The connections between the fibers of the entering and the interior cables are typically made inside an OCEF using a commercially available fusion splicing device, for example, a model S123M12 v2 mass fusion splicer available from OFS Fitel, LLC, Norcross, Ga. Reliable, low loss optical communication links are thus established between users inside the premises, and networks outside the premises. It will be understood, however, that the area of floor space available in the basement or elsewhere at the premises for installation of an OCEF will limit the maximum size and capacity of an OCEF that can be deployed.

Optical cables that enter the premises from outside (hereafter "incoming cables") typically have large diameters with high fiber counts, e.g., 1728, 3456, or more ribbonized fibers per cable, and are rigid due to their size and construction. The proper management and organization of incoming cables and their fibers can therefore be difficult and consume much volume inside an OCEF. By contrast, cables routed from the OCEF to interior locations at the premises (hereafter "outgoing cables") usually have lower fiber counts, smaller diameters, and are relatively flexible.

U.S. Pat. No. 5,640,482 (Jun. 17, 1997) discloses a fiber optic cable management rack that contains a number of stacked interconnection enclosures, and U.S. Pat. No. 8,750, 667 relates to a modular system for connecting an external communication network to a local user network. In the system of the '667 patent, a number of user and operator modules are mounted one above another on a building wall. Optical cables associated with users and network providers are routed alongside the corresponding modules and enter the modules through their side walls.

A wall mountable OCEF cabinet is offered by Sumitomo Electric Lightwave under the designation "U-HSX". The cabinet is described as having a capacity to store 1,728 mass fusion splices for 20,736 fibers, entry ports capable of accepting ribbon cables of up to 3456 fiber count, and 72 ribbon cable distribution ports. If more capacity is needed, then two or more of the cabinets must be installed. For customers having limited accessible wall space, however, it may not be possible to install more than a single cabinet, especially if the cable entry ports are formed in a side wall of the cabinet as is typical. In such cases, in addition to the area occupied by the cabinet on a wall, enough horizontal space must be available to route each entering cable firmly along the wall over a path leading to an entry port on the side of the cabinet, without bending the cable to a degree that could damage or degrade the cable fibers.

Accordingly, there is a need for a telecommunication cabinet construction that does not require additional horizontal wall space for an installation of two or more cabinets, regardless of the number of incoming cables that will enter the cabinets at the premises. There is also a need for a telecommunication cabinet that requires little, if any, additional horizontal wall space for routing and supporting incoming cables at the premises.

SUMMARY OF THE INVENTION

According to the invention, a telecommunication cabinet for managing connections between incoming and outgoing cables at building premises, includes a back wall, a bottom wall, a top wall, and left and right walls. The bottom wall has a first incoming cable port that is open along a front edge of the bottom wall, the top wall has a second incoming cable port that is open along a front edge of the top wall, and the second incoming cable port is aligned vertically with the first incoming cable port. Thus, one or more layers of incoming cables can either enter the cabinet for connection or pass through the cabinet to enter a second cabinet, by inserting the layers of incoming cables from the front of the cabinet into either one or both of the incoming cable ports through the front edges of the bottom and the top walls of the cabinet.

At least one of the left and the right walls has one or more outgoing cable ports for passage of outgoing cables, and cable clamp assemblies are constructed and arranged to fix the cables of each layer of incoming cables at corresponding positions inside the incoming cable ports.

For a better understanding of the invention, reference is made to the following description taken in conjunction with the accompanying drawing and the appended claims.

DETAILED DESCRIPTION OF THE INVENTION

Figure 1:
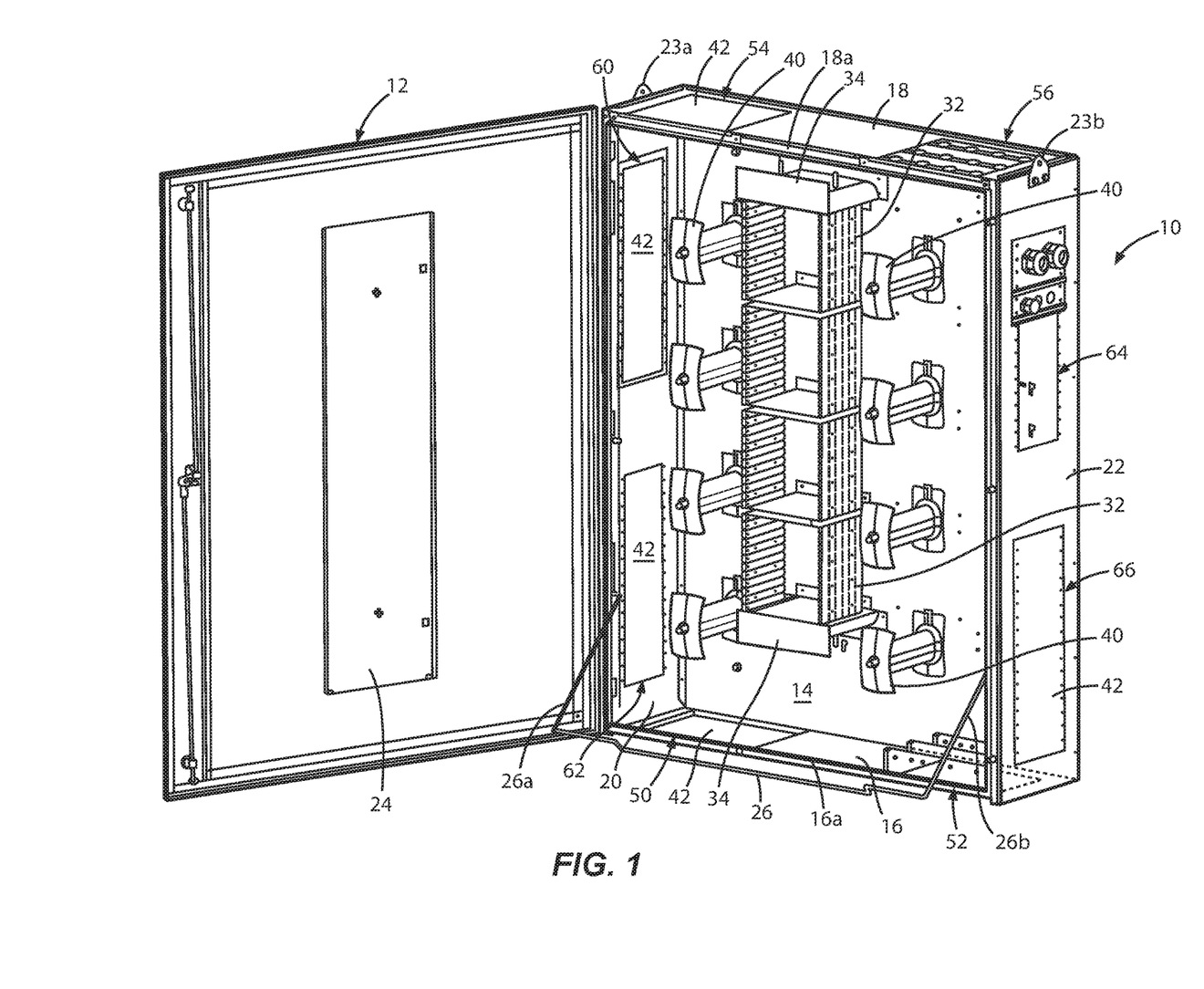
FIG. 1 is a perspective view of a telecommunication cabinet according to one embodiment of the invention, with a front door of the cabinet swung open to show the interior construction of the cabinet.

FIG. 1 shows a telecommunication cabinet 10 according to the invention. A hinged front door 12 is shown at an open position toward the left of the cabinet 10 as viewed in FIG. 1. Although the door 12 swings open to the left, it will be understood that the door 12 may optionally be hinged to open toward the right.

In the illustrated embodiment, the cabinet 10 facilitates the task of connecting optical fibers of incoming cables originating from outside the premises where the cabinet 10 is installed, with corresponding fibers of outgoing cables that are associated with users inside the premises. As mentioned, the connections are typically made by fusion splicing ends of the corresponding fibers to one another using a commercially available splicing machine.

Cabinet 10 may be formed, for example, from 10 gauge (0.100 inch thick) type 5052 H32 aluminum sheet, and measure approximately 60 inches high by 48 inches wide by 13 inches deep. The cabinet has a back wall 14. A bottom wall 16, a top wall 18, a left wall 20, and a right wall 22 extend from the perimeter of the back wall 14. To facilitate manufacture of the cabinet 10, each of the walls 14-22 can be formed separately and then riveted or otherwise joined to one another. Because the cabinet 10 is intended for installation in a basement or other location inside a building, it is not necessary to construct the cabinet for use outdoors or to require grounding, unless specified otherwise by a customer.

To assist in handling and in mounting the cabinet 10 on a wall or other supporting surface at a given premises, a pair of lift brackets 23a, 23b can be fixed atop the left and the right cabinet walls 20, 22 as shown in FIG. 1. Other installation and mounting hardware may also be supplied with the cabinet for the convenience of a given customer as well.

In the embodiment of FIG. 1, a splice work table 24 is mounted for storage inside the cabinet door 12. The table 24 can later be removed and used to support a splicing machine when fibers of cables brought inside the cabinet 10 are ready to be spliced to one another. For example, a forward edge of the table 24 can be configured to snap onto or otherwise engage a wire holder 26 that is pivoted to swing outward near the bottom wall 16 of the cabinet 10, and a rear edge of the table 24 can be formed to engage mounting pins located at two different vertical levels along flanges at the front of the left and the right cabinet walls 20, 22, thereby keeping the table 24 level and steady at either one of two working positions at which a splicing machine is placed on the table 24 and operated by an installer.

As shown in the drawing, side arms 26a, 26b of the wire holder 26 have their free ends engaged for vertical sliding movement in corresponding slots formed in the left and right walls 20, 22 of the cabinet. Thus, the holder 26 can be raised and made flush with the front opening of the cabinet 10 in order to allow the door 12 to be fully closed.

As detailed herein, the cabinet 10 can accommodate more than 13,000 fibers. If even greater connection capacity is needed, two or more of the cabinets 10 can be stacked, i.e., aligned one above the another rather than side-by-side. See FIG. 9 and related text below. This is advantageous for most users who may have enough vertical wall space to stack two or three of the cabinets 10, but who lack enough horizontal wall and floor space to accommodate a side-by-side installation.

Figure 2:
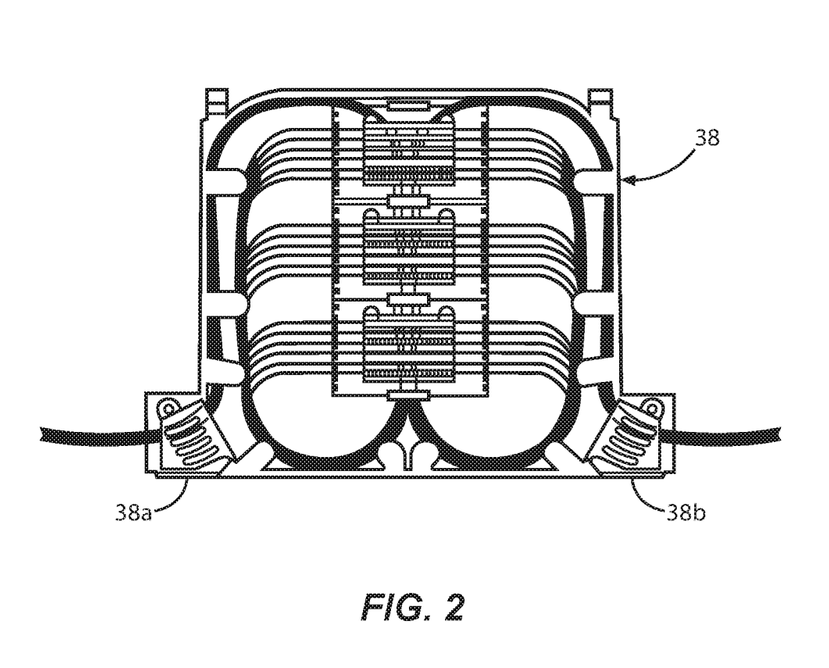
FIG. 2 is a view of a splice tray for holding spliced ends of a number of pairs of incoming and outgoing cable fibers, wherein the tray can be received for storage in a compartment inside the cabinet in FIG. 1.

Four splice tray compartments 32 are aligned vertically between a pair of end brackets 34 over either a left or a right portion of the cabinet back wall 14, depending on the side of the cabinet 10 at which the incoming cables will enter the cabinet. Each compartment 32 is constructed in a known manner to store up to, e.g., 12 commercially available splice trays 38 one of which is shown in FIG. 2. Fibers in the form of, e.g., 12-fiber ribbons contained in the incoming cables may each enter a given tray 38 from a branch 38a at the left of the tray in FIG. 2, and ribbonized fibers of outgoing cables to which the incoming fibers have been spliced may leave the tray 38 from a branch 38b at the right of the tray. Conventional fiber organizers 40 are aligned next to the splice tray compartments 32 as shown in FIG. 1. The organizers 40 help to manage or dress incoming and outgoing fibers whose spliced ends are held in the trays 38 stored in the adjacent compartments 32.

Two incoming cable ports 50, 52 are formed in the bottom wall 16 of the cabinet 10, near opposite ends of the wall 16 as viewed in FIG. 1. Two more incoming cable ports 54, 56 are formed in the top wall 18 of the cabinet 10, near the opposite ends of the wall 18. Cable port 50 in the bottom wall 16 and cable port 54 in the top wall 18 are aligned vertically with one another. Likewise, cable port 52 in the bottom wall 16 and cable port 56 in the top wall 18 are aligned vertically with one another. Moreover, each one of the cable ports 50, 52, 54, and 56 can be opened along a front edge 16a, 18a of the wall in which the port is formed. Accordingly, incoming cables can be routed through the port simply by urging the cables sideways into the port, rather than having to bend and thread the cables through the port.

It will be appreciated that the construction of the cabinet 10 serves to overcome a number of difficulties encountered during the installation and use of the prior cabinets. As mentioned, incoming cables that enter the premises from outside are often rigid and have a large diameter. Therefore, to avoid damaging the cables, an installer must take time and exercise due care when routing the cables from their point of entry at the premises, and bending the cables in order to thread them through openings formed in the walls of the existing cabinets.

By contrast, incoming cables can be loaded quickly into the inventive cabinet 10 simply by urging them sideways into a given incoming cable port along the front edges 16a, 18a of the bottom and top cabinet walls. If two or more cabinets 10 are stacked so that their cable ports are vertically aligned, the aligned ports form a vertical passage through which each of two or more layers of incoming cables can either enter one of the cabinets to connect with an outgoing cable inside the cabinet, or pass entirely through the cabinet to enter another cabinet to connect with an outgoing cable inside the other cabinet. The vertical passage through the stacked cabinets facilitates the installation of additional layers of incoming cables, removal of certain layers, and maintenance of the cables. It will be understood that the bottom and the top walls 16, 18 of the cabinet 10 may have only one pair of vertically aligned incoming cable ports, or more than two pairs of vertically aligned incoming cable ports, depending on the physical dimensions and connection capacity of the cabinet.

In the FIG. 1 embodiment, a removable blind plate 42 may be initially supplied on the cabinet 10 to extend over each one of the incoming cable ports 50-56. Thus, the user only needs to remove the plate or plates that cover a cable port through which incoming cables are expected to enter into or pass through the cabinet 10 when installed.

Two outgoing cable ports 60, 62 are formed in upper and lower portions of the left wall 20 of the cabinet 10 as viewed in FIG. 1, and two more outgoing cable ports 64, 66 are formed in upper and lower portions of the right wall 22 of the cabinet. It will be understood that the left and the right walls 20, 22 of the cabinet 10 may each have only one, or more than two outgoing cable ports depending on the connection capacity and physical dimensions of the cabinet. Moreover, blind plates 42 may also be supplied on the cabinet to extend over each one of the outgoing cable ports 60-66, so that the customer only needs to remove the plate or plates that cover a cable port through which outgoing cables are expected to pass at a customer's premises.

Figure 3:
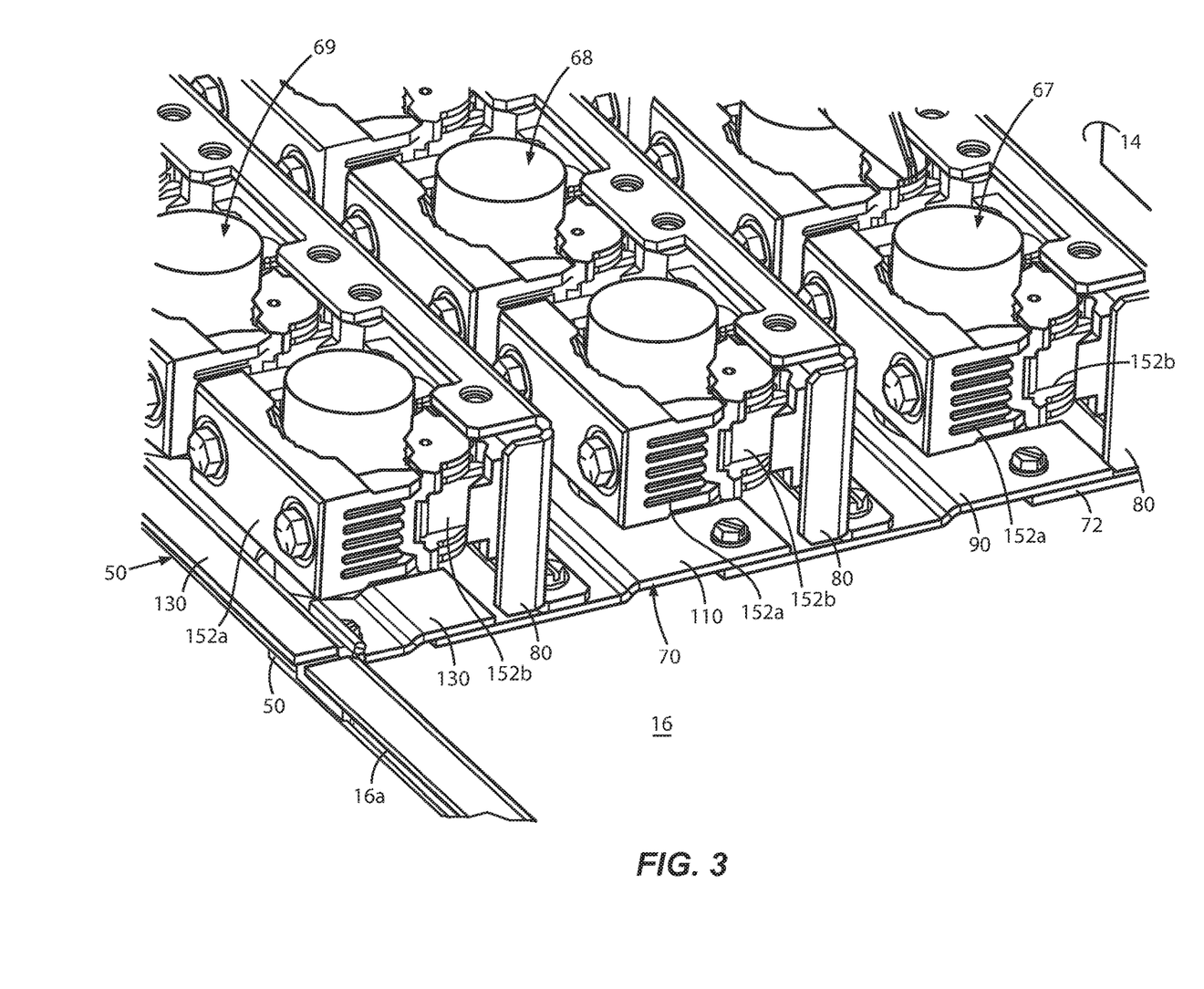
FIG. 3 is an enlarged view of a lower right portion of the cabinet in FIG. 1, showing a cable clamp assembly installed within an incoming cable port in a bottom wall of the cabinet for fixing layers of incoming cables.

FIG. 3 is an enlarged view of a lower left portion of the cabinet 10 in FIG. 1, wherein three layers 67, 68, 69 of incoming cables have been inserted successively from the front of the cabinet 10 into the port 50 though the open front edge 16a of the wall, after a blind plate 42 that may have covered the port is removed. Each layer includes four incoming cables, and the cables of each layer are fixed at corresponding positions within the port 50 by a cable clamp assembly 70. The cable clamp assembly 70 in FIG. 3 includes a number of generally rectangular base plates that are illustrated in FIGS. 4 to 7.

Figure 4:
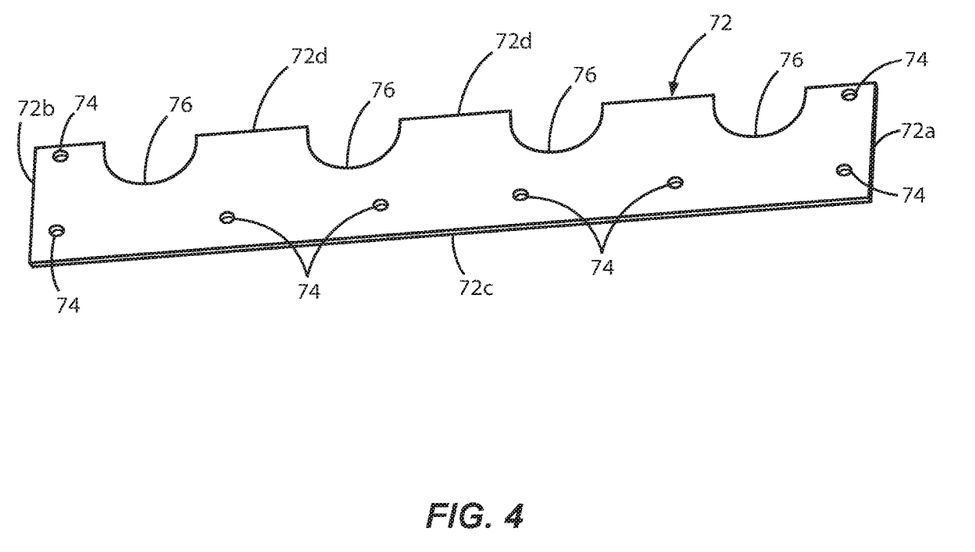
FIGS. 4 to 7 show base plates used in the cable clamp assembly in FIG. 3.
Figure 8:
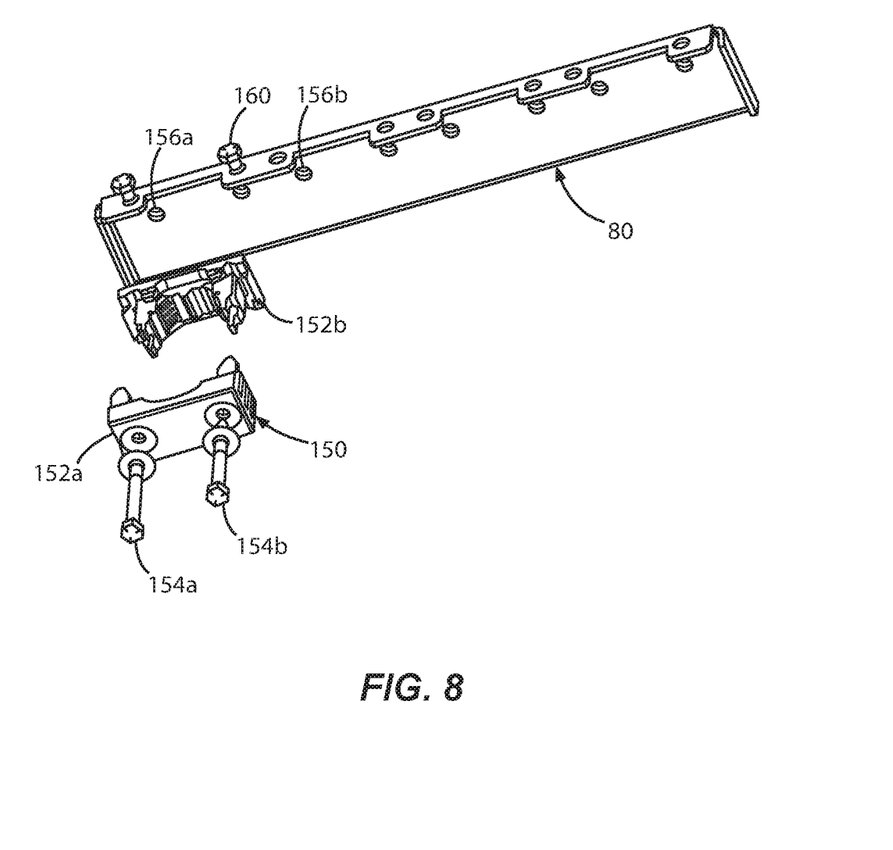
FIG. 8 shows a bracket and a clamp, a number of which are used in the cable clamp assembly in FIG. 3.

FIG. 4 shows a first or back base plate 72. The plate 72 is dimensioned to extend across the width of the incoming cable port 50 when opposite side edges 72a, 72b of the plate are fastened by screws to edges of the bottom wall 16 that border on the port 50. Each base plate has a number of screw holes 74. A pair of holes 74 are formed at each side edge 72a, 72b of the plate 74 for screws to fasten the plate to the bottom wall 16. Remaining holes 74 intermediate the edges 72a, 72b of the plate 72 are provided next to a back edge 72c of the plate for mounting a clamp bracket 80. The clamp bracket 80 is shown in FIG. 8.

The base plate 72 also has four cutouts 76 formed along a front edge 72d of the plate. The plate 72 is mounted with the bracket 80 across the incoming cable port 50 next to the cabinet back wall 14, with the cutouts 76 facing toward the front of the cabinet 10. When the first layer 67 of four incoming cables is inserted into the port 50 from the front of the cabinet 10, the four cutouts 76 in the plate 72 are dimensioned and arranged to receive corresponding cables of the layer 67, and to align each cable to be clamped to the bracket 80 at the back of the plate as shown at the right in FIG. 3.

Figure 5:
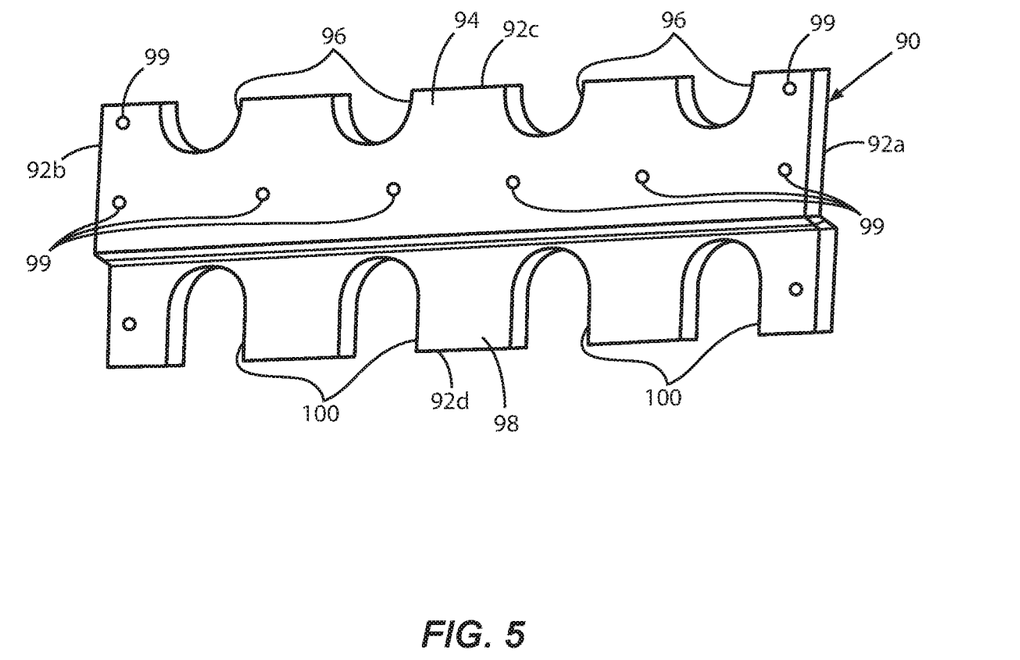

FIG. 5 shows a second base plate 90. Like the first base plate 72, the second base plate 90 is dimensioned to extend across the width of the incoming cable port 50 when opposite side edges 92a, 92b of the plate are fastened by screws to the edges of the bottom wall 16 that border on the port 50. A rear half 94 of the second base plate 90 has four cutouts 96 formed along a rear edge 92c of the plate, the cutouts 96 corresponding in position to the cutouts 76 in the first base plate 72. A front half 98 of the second base plate 90 is stepped downward from the first half 94 by an amount corresponding to the thickness of the first base plate 72, and the front half 98 of the second plate 90 also has four cutouts 100 formed along a front edge 92d of the plate 90.

After the first layer 67 of incoming cables is received in the cutouts 76 of the first base plate 72 and the cables are clamped to bracket 80 at the back of the plate 72, another clamp bracket 80 is mounted on the rear half 94 of the second base plate 90 via screws into holes 99 that are formed across the rear half of the plate 90. The rear half 94 of the second base plate 90 is then placed over the first base plate 72 so that the first layer 97 of incoming cables is also received in the cutouts 96 in the rear half 94 of the plate 90. The rear half 94 of the plate 90 is then fastened at its sides to the edges of the bottom wall 16 by screws through the side edges 92a, 92b of the rear half 94 of the plate.

When the second layer 68 of four incoming cables is inserted into the port 50 from the front of the cabinet 10, the four cutouts 100 in the front half 98 of the second base plate 90 are dimensioned and arranged to receive corresponding cables of the second layer 68, and to align each cable of the layer to be clamped to the bracket 80 when mounted across the plate 90.

Figure 6:
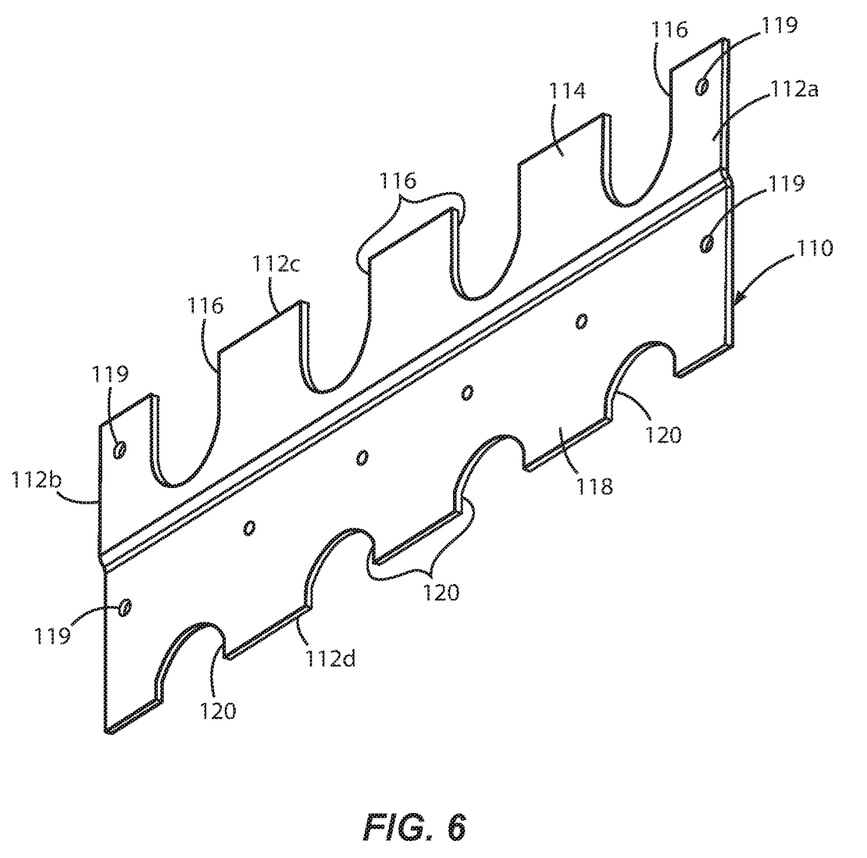

FIG. 6 shows a third base plate 110. Like the second plate 90, the third base plate 110 is dimensioned to extend across the width of the incoming cable port 50 when opposite side edges 112a, 112b of the plate are fastened by screws to edges of the bottom wall 16 that border the port 50. A rear half 114 of the third base plate 110 has four cutouts 116 formed along a rear edge 112c of the plate, the cutouts 116 corresponding in position to the cutouts 100 in the front half 98 of the second base plate 90. A front half 118 of the third base plate 110 is stepped downward from the first half 114 by an amount corresponding to the thickness of the second base plate 90. The front half 118 also has four cutouts 120 formed along a front edge 112d of the plate 110.

After the second layer 68 of four incoming cables is received in the cutouts 100 in the front half 98 of the second base plate 90 and the cables are clamped to the bracket 80 mounted across the plate 90, another clamp bracket 80 is mounted on the front half 118 of the third base plate 110 via screws into holes 119 formed across the front half 118 of the plate 110. The rear half 114 of the third base plate 110 is placed over the second base plate 90 so that the second layer 68 of incoming cables is also received in the cutouts 116 in the rear half 114 of the plate 110. The rear half 114 of the plate 110 is then fastened at its sides by screws into bordering edges of the bottom cabinet wall 16.

When the third layer 69 of four incoming cables is inserted into the port 50 from the front of the cabinet 10, the four cutouts 120 in the front half 118 of the third base plate 110 are dimensioned and arranged to receive corresponding cables of the third layer 69, and to align each cable of the layer to be clamped to the bracket 80 mounted across the plate 110.

Figure 7:
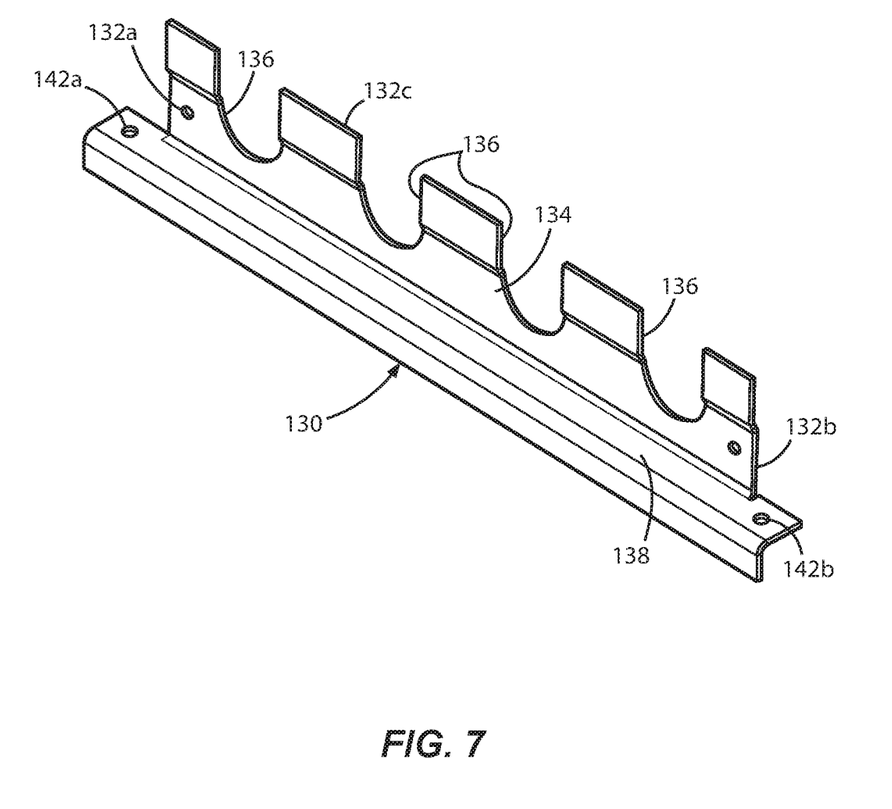

FIG. 7 shows a fourth or front base plate 130. Like the other base plates, the fourth base plate 130 is dimensioned to extend across the width of the incoming cable port 50 when opposite side edges 132a, 132b of the plate are fastened by screws to edges of the bottom wall 16 that border the port 50.

A rear portion 134 of the front base plate 130 has four cutouts 136 formed along a rear edge 132c of the plate, the cutouts 136 corresponding in position to the cutouts 120 in the front half 118 of the third base plate 110. A front portion 138 of the front base plate 130 is dimensioned to overlap a raised lip 140 that is formed along the front edge 16a of the cabinet bottom wall 16, at both sides of the port 50.

After the third layer 69 of four incoming cables is received in the cutouts 120 in the front half 118 of the third base plate 110, and the cables are clamped to the bracket 80 on the plate 110, the rear portion 134 of the front base plate 130 is placed over the third base plate 110 so that the third layer 69 of incoming cables is also received in the cutouts 136 in the rear portion 134 of the front base plate 130. The rear portion 134 of the plate 130 is then fastened to the edges of the bottom wall 16 that border the port 50 by screws through openings 132a, 132b at the side edges of the rear portion 134. The front portion 138 of the base plate 130 is then fastened by screws to the raised lip along the front of the cabinet bottom wall 16, through openings 142a, 142b at opposite sides of the front portion 138 of the plate 130.

FIG. 8 shows one of the three clamp brackets 80 in FIG. 3, and a two-part clamp 150 constructed and arranged to clamp each cable of the corresponding layers 67, 68, 69 of incoming cables against the bracket 80 after the bracket is mounted on each one of the base plates 72, 90, 110. When a given cable layer is inserted into the port 50 from the front of the cabinet 10, the cables of the layer are positioned and spaced apart from one another according to the locations of the cutouts in the corresponding base plate.

As seen in the drawing, each clamp 150 includes a top part 152a and a bottom part 152b. Both of the clamp parts 152a, 152b have a generally U-shaped profile. The parts 152a, 152b may be grooved on their inside surfaces to grip an incoming cable firmly when the parts encircle the cable and are urged toward one another by screws 154a, 154b. The screws are dimensioned to pass through openings formed at the sides of the clamp parts 152a, 152b, and to engage threaded holes 156a, 156b at corresponding positions along the bracket 80.

Figure 9:
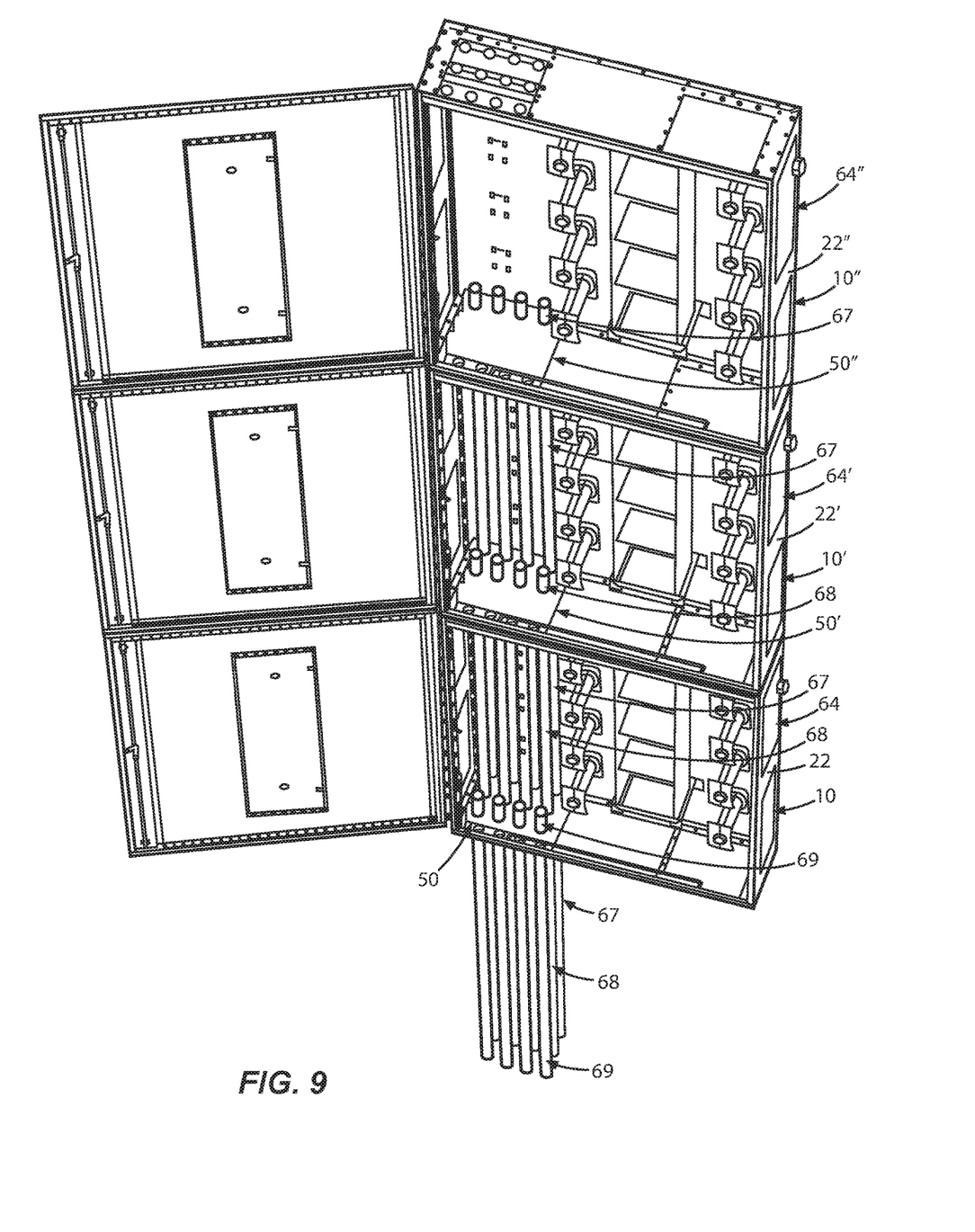
FIG. 9 shows a vertical stack of three of the cabinets in FIG. 1 configured for servicing three layers of incoming cables at a premises.

Because of the construction of cabinet 10 and as shown in FIG. 9, it will be appreciated that if three of the cabinets 10, 10', and 10" are stacked so that their incoming cable ports 50, 50', 50" are aligned vertically with one another, the first layer 67 of four incoming cables can pass through the first cabinet 10 and the second cabinet 10', and enter the third cabinet 10" to connect with outgoing cables that pass through the port 64" in the right wall 22" of the third cabinet 10". Next, the second layer 68 of four incoming cables can pass through the first cabinet 10 and enter the second cabinet 10' to connect with outgoing cables passing through the port 64' in the right wall 22' of the second cabinet 10'. Finally, the third layer 69 of four incoming cables can enter the first cabinet 10 to connect with outgoing cables passing through the port 64 in the right wall 22 of the first cabinet 10.

In the illustrated embodiment, the incoming cable ports 50 to 56 of the cabinet 10 may be opened at either the left side of the bottom and the top cabinet walls 16, 18, or at the right side of the walls 16, 18. The choice of which side to use for inserting the layers of incoming cables can be determined at the time of installation according to the site layout. The pair of brackets 34 that support the splice tray compartments 32 can then be located at one of two defined positions on the cabinet back wall 14, so that the compartments 32 are optimally aligned with respect to the side of the cabinet 10 at which the incoming cable layers will enter or pass through the cabinet.

As mentioned, an advantage of the construction of the cabinet 10 is that it saves floor space, speeds installation, and adapts well to particular installation requirements. The cabinet 10 is well suited for customers whose floor space is limited, but who have relatively unrestricted height available at their premises. Also, in the disclosed embodiment, each cabinet 10 can service up to 13,824 total fibers from four incoming cables, and allow eight other cables each of the same fiber count (3,456) to pass through and enter two other stacked cabinets for connection with outgoing cables at the premises.

Installation

Up to three of the cabinets 10 can be installed at the same time, or by separate installations spaced in time. Layers of incoming cables enter or pass through each cabinet through the ports in the bottom and the top walls 16, 18 of the cabinet. The cables may have high fiber counts (up to, e.g., 3456 fibers each) and large diameters (up to, e.g., 33 mm).

Outgoing cables pass through the left and/or the right walls 20, 22 of the cabinet 10. The outgoing cables may be secured to the cabinet 10 in a known manner using cable glands or/and clamps. Outgoing cables are usually smaller in diameter and have a lower fiber count. As disclosed, each cabinet 10 can accommodate outgoing cables of up to, e.g., 33 mm diameter. Known clamp or cord grip systems may be used to secure the outgoing cables in the vicinity of the ports 60-66 through which they may pass. For example, one system may be used for cables up to 0.75 inch diameter, and another system for cables of from 0.25 to 1.5 inches diameter. The choice of the securing system is application dependent and may be specified by the customer.

In the disclosed embodiment, the two outgoing cable ports 60, 62 in the left cabinet wall 20, or the two outgoing cable ports 64, 66 the right cabinet wall 22, can pass 48 outgoing cables each having up to 0.75 inch diameter, wherein each outgoing cable has a fiber count of 288 so as to provide a total of 13,824 fibers to match the total fiber count of a layer of four incoming cables, each of which has a fiber count of 3456. The two outgoing cable ports 60, 62, or the two outgoing cable ports 64, 66 may instead pass a total of 24 outgoing cables each having up to 1.5 inches diameter.

Each time a new layer of incoming cables is installed, corresponding ones of the base plates 72, 90, 110, 130 are mounted across the selected incoming cable ports 50, 54, or 52, 56, with associated brackets 80 and clamps 150 as needed for the installation. If stacked, the vertical distance between the cabinets 10 is not critical for system performance, but may be important if the height of the area available for the installation is limited. In such cases, the cabinets may be spaced vertically apart by, e.g., two inches or less if the lift brackets 23a, 23b in FIG. 1 are removed.

Example One

Installation of Three Stacked Cabinets at the Same Time (FIG. 9)

FIG. 9 shows the three of the inventive cabinets 10, 10', 10" installed at the same time in a vertically stacked configuration to service the three layers of incoming cables 67, 68, 69. The first layer 67 of four incoming cables is inserted through a vertically aligned pair of incoming cable ports in the first cabinet 10, for example, ports 50, 54; through the vertically aligned ports 50', 54' in the second cabinet 10'; and then through the incoming cable port 50" of the third cabinet 10" directly above the second cabinet 10'. Cables of the first layer 67 are fixed by clamps 150 against bracket 80 mounted on the first or back base plate 72 at each of the ports, wherein the base plate 72 and the bracket 80 are initially mounted at the mentioned ports.

The cables of the first layer 67 are opened inside the third cabinet 10" (i.e., the top cabinet), and their fibers are spliced to fibers of outgoing cables that pass through the outgoing cable ports in the right wall 22" of the cabinet 10". For added restraint, an aramid yarn provided in each incoming cable can be wrapped around threaded anchor posts 160 provided atop the clamp brackets 80. See FIG. 8.

Spliced portions of the incoming and the outgoing cable fibers are stored in the splice trays 38 inside the top cabinet 10', and excess lengths of fiber are managed by the organizers 40". It may not always be necessary to restrain the incoming cables in a cabinet when the cables only pass through and are not opened inside the cabinet, but the cables are still fixed in position by the clamps 150 and brackets 80 for additional security and restraint.

Next, the second base plate 90 is mounted with bracket 80 across each of the aligned incoming cable ports 50, 54 in the first cabinet 10, and across the incoming cable port 50' of the second (middle) cabinet 10' directly above the first cabinet 10. The second layer 68 of four incoming cables is passed through the ports 50, 54 in the first cabinet 10, and the layer 68 enters the second cabinet 10' through its incoming cable port 50'. The cables are opened inside the second cabinet 10', restrained by clamps 150 against the bracket 80 on the second base plate 90, and the cable fibers are spliced to fibers of the outgoing cables inside the second cabinet 10'.

Finally, the third base plate 110 is mounted with bracket 80 across the incoming cable port 50 of the first cabinet 10 through which the third layer 69 of four incoming cables will enter the cabinet. When the third layer 69 of cables are inserted through the port 50 of the first cabinet 10, the cables are opened inside the cabinet 10, fixed in position by clamps 150 against the bracket 80 on the third base plate 110, and their fibers are spliced to fibers of outgoing cables inside the first cabinet 10. The fourth or front base plate 130 is then mounted across the port 50 in the first cabinet 10, in front of the third layer 69 of cables.

Example Two

Installation of One Cabinet at a Time

Each of the cabinets 10, 10', 10" in FIG. 9 may also be installed on separate occasions in the named order, for example, when all three layers 67, 68, 69 of incoming cables enter the premises over a period of time rather than all at once. In such a case, the first or back base plate 72 with a mounted bracket 80 is mounted at each of the vertically aligned pair of incoming cable ports 50, 54 in the bottom cabinet 10. The first layer 67 of four cables is inserted from the front of the cabinet 10 into the cable port 50. The incoming cables are opened for connection, and are fixed in position within the port 50 by clamps 150 against bracket 80 mounted on the first base plate 72.

When a second cabinet 10' needs to be installed to service the second layer 68 of incoming cables, incoming cable port 50' in the bottom wall 16' of the second cabinet 10' is aligned above the incoming cable port 54 atop the first cabinet 10. A second base plate 90 with bracket 80 are mounted in front of the first layer 67 of cables already fixed in the incoming cable port 50 in the first cabinet 10, and a first or back base plate 72 with bracket 80 are mounted across the incoming cable port 50' in the second cabinet 10'.

The second layer 68 of incoming cables is passed through the vertically aligned incoming cable ports 50, 54, in the first cabinet 10, and the cables are fixed in position by the brackets 80 and clamps 150 within the ports, The second layer 68 of cables is then inserted into the aligned incoming cable port 50' in the second cabinet 10', the cables are opened for connection, and the cables are fixed in position within the port 50' by the brackets 80 and clamps 150 on the first base plate 72, When a third cabinet 10" is needed later to service the third layer 69 of incoming cables, the cabinet 10" is stacked above the second cabinet 10' so that the incoming cable port 50" in the bottom wall 16" of the third cabinet 10" is aligned vertically above the incoming cable port 54' atop the second cabinet 10'. A third base plate 110 with bracket 80 are mounted in front of the second layer 68 of cables that are fixed in the incoming cable port 50 in the first cabinet 10, a second base plate 90 with bracket 80 are mounted in front of the first layer 67 of cables fixed in the ports of the first and the second cabinets, and a first base plate 72 with bracket 80 are mounted across the incoming cable port 50" in the third cabinet.

The third layer 69 of incoming cables is passed through the first and the second incoming cable ports in the first and the second cabinets, and the cables are fixed in position by the brackets 80 and clamps 150 within the ports, The third layer 69 of cables is then inserted into the incoming cable port 50" of the third cabinet 10", the cables are opened for connection, and are fixed in position within the selected port by the brackets 80 and clamps 150 on the first base plate 72. The fourth or front base plate 130 is then mounted in front of the third layer 69 of incoming cables that are fixed in the incoming cable port 50 of the first cabinet 10.

As disclosed herein, the inventive telecommunication cabinet 10 improves the ease with which large cables can be managed and spliced inside a wall mounted cabinet, and it reduces the time required to perform those tasks. If increased capacity is needed, two or three of the cabinets can be stacked vertically without the need for added horizontal wall or floor space. In particular, the cabinet 10 has the following advantages:

1. Installation of the cabinet alone or in a stacked configuration occupies substantially less horizontal wall space compared to existing cabinets.
2. Up to three cabinets may be stacked at once, or installed separately over a period of time.
3. High fiber count capacity.
4. Outside cables can approach and enter the cabinet directly from the top or bottom of the cabinet without threading, thus avoiding potentially harmful cable bends. This is particularly important for large diameter cables.
5. Optical cables can be opened and their fibers can be spliced inside the cabinet for additional protection.
6. Connectorized outgoing cables can be pre-installed in the cabinet.

While the foregoing represents preferred embodiments of the present invention, it will be understood by persons skilled in the art that various changes, modifications, and additions can be made without departing from the spirit and scope of the invention.

For example, while the cabinet 10 as disclosed herein is used to facilitate connections between optical fibers of incoming and outgoing cables, it will be appreciated that the cabinet 10 can be easily modified to accommodate hybrid cables that contain conductive wires in addition to optical fibers, or cables that contain only conductive wires.

Also, instead of splicing, the fibers or wires of the cables may instead be terminated with connectors that are configured to mate with one another inside the cabinet, either directly or through corresponding adapters.

Accordingly, the invention includes all such changes, modifications, and additions that are within the scope of the following claims.

We claim:
1. A stackable telecommunication cabinet for managing connections between incoming and outgoing cables at building premises, comprising:
   a back wall;
   a bottom wall, a top wall, and left and right walls extending from the back wall;

the bottom wall of the cabinet has a first incoming cable port that is configured to open along a front edge of the bottom wall, so that incoming cables are loaded into the cabinet by urging the cables sideways from the front of the cabinet into the first incoming cable port when open along the front edge of the bottom wall of the cabinet;

the top wall of the cabinet has a second incoming cable port that is configured to open along a front edge of the top wall, wherein the second incoming cable port is aligned vertically with the first incoming cable port so that one or more layers of incoming cables can enter the cabinet through the first incoming cable port either for connection to outgoing cables inside the cabinet, or to pass through the second incoming cable port to enter a second like cabinet, by urging the layers sideways from the front of the cabinet into one or both of the first and the second incoming cable ports when open at the front edges of the bottom and the top walls of the cabinet;

at least one of the left and the right walls has one or more outgoing cable ports for passage of the outgoing cables; and a cable clamp assembly constructed and arranged for installation within a given incoming cable port to fix the cables of each layer of incoming cables at corresponding positions inside the given port;

wherein the cable clamp assembly includes:

a first base plate having first cutouts formed along a front edge of the plate, the first cutouts being sized for receiving corresponding incoming cables of a first layer of incoming cables, a first clamp bracket dimensioned and formed to be mounted next to a back edge of the first base plate, and a number of first clamps constructed and arranged to clamp the incoming cables of the first layer received in the first cutouts to the first clamp bracket on the first base plate; and a second base plate having second cutouts formed along a rear edge of the plate which correspond in position to the first cutouts formed along the front edge of the first base plate, for receiving the incoming cables of the first layer that are clamped to the first clamp bracket on the first base plate, and the second base plate has third cutouts formed along a front edge of the second base plate for receiving corresponding incoming cables of a second layer of incoming cables, a second clamp bracket dimensioned and formed to be mounted on a rear half of the second base plate, and a number of second clamps constructed and arranged to clamp the incoming cables of the second layer received in the third cutouts to the second clamp bracket on the second base plate.

2. A telecommunication cabinet according to claim 1, including a front door hinged to either one of the left or the right walls of the cabinet for swinging movement between open and closed positions with respect to the cabinet.

3. A telecommunication cabinet according to claim 2, including a splice work table arranged to be mounted for storage on an inside surface of the front door of the cabinet for splicing optical fibers contained in the incoming and the outgoing cables to one another.

4. A telecommunication cabinet according to claim 3, including a holder arranged in the vicinity of the bottom wall of the cabinet, for supporting the work table in an operating position.

5. A telecommunication cabinet according to claim 1, including a number of splice tray compartments aligned over the back wall of the cabinet, wherein each of the compartments is dimensioned and arranged to receive a certain number of splice trays for storing splices between optical fibers contained in the incoming and the outgoing cables to one another.

6. A telecommunication cabinet according to claim 5, including cable organizers arranged to be fixed to the back wall of the cabinet in the region of the splice tray compartments, for managing or dressing spliced fibers of the incoming and the outgoing cables.

7. A telecommunication cabinet according to claim 1, including removable blind plates for covering certain ones of the incoming and the outgoing cable ports in the absence of incoming cables passing through the ports.

8. A telecommunication cabinet according to claim 1, including lift brackets fixed to the left and the right wall of the cabinet.

9. A telecommunication cabinet according to claim 1, wherein the walls of the cabinet are riveted to one another.

10. A telecommunication cabinet installation, comprising:

a supporting surface; and two or more telecommunication cabinets according to claim 1, wherein the cabinets are mounted on the supporting surface so that a second incoming cable port in a top wall of a first cabinet is vertically aligned with a first incoming cable port in a bottom wall of a second cabinet that is mounted above the first cabinet.

11. A telecommunication cabinet installation according to claim 10, comprising three of the cabinets.

12. A telecommunication cabinet installation according to claim 10, wherein the supporting surface is a basement wall at the building premises.

13. A telecommunication cabinet according to claim 1, wherein the cable clamp assembly includes a third base plate having fourth cutouts formed along a rear edge of the plate which correspond in position to the third cutouts formed along the front edge of the second base plate, for receiving the incoming cables of the second layer that are clamped to the second clamp bracket on the second base plate, and the third base plate has fifth cutouts formed along a front edge of the third base plate for receiving corresponding incoming cables of a third layer of incoming cables, a third clamp bracket dimensioned and formed to be mounted on a rear half of the third base plate, and a number of third clamps constructed and arranged to clamp the incoming cables of the third layer received in the fifth cutouts to the third clamp bracket on the third base plate.

14. A telecommunication cabinet according to claim 13, wherein the cable clamp assembly includes a fourth base plate configured to be fastened across an incoming cable port in front of the third base plate, and the fourth base plate has sixth cutouts formed along a back edge of the plate which correspond in position to the fifth cutouts formed along the front edge of the third base plate, for receiving the incoming cables of the third layer that are clamped to the third clamp bracket on the third base plate.

* * * * *